(12) United States Patent
Levy (10) Patent No.: US 9,815,575 B2
(45) Date of Patent: Nov. 14, 2017

(54) ON-ORBIT RECONFIGURABLE SOLAR ARRAY

(75) Inventor: Robert K. Levy, Houston, TX (US)

(73) Assignee: THE BOEING COMPANY, Chicago, IL (US)

( * ) Notice: Subject to any disclaimer, the term of this patent is extended or adjusted under 35 U.S.C. 154(b) by 530 days.

(21) Appl. No.: 13/617,747

(22) Filed: Sep. 14, 2012

(65) Prior Publication Data

US 2014/0077626 A1    Mar. 20, 2014

(51) Int. Cl.
| H02H 3/42 | (2006.01) |
| B64G 1/42 | (2006.01) |
| B64G 1/44 | (2006.01) |
| B64G 1/10 | (2006.01) |

(52) U.S. Cl.
CPC ............ B64G 1/428 (2013.01); B64G 1/44 (2013.01); B64G 1/443 (2013.01); B64G 2001/1064 (2013.01); Y10T 307/832 (2015.04)

(58) Field of Classification Search
CPC ........................................................ H02H 3/42
USPC ........................................................ 307/126
See application file for complete search history.

(56) References Cited

U.S. PATENT DOCUMENTS

| 5,172,098 A * | 12/1992 | Leyden et al. ............ 340/568.2 |
| 5,669,586 A * | 9/1997 | Tadros ........................ 244/167 |
| 6,262,558 B1 * | 7/2001 | Weinberg ..................... 320/101 |
| 6,505,795 B1 * | 1/2003 | Thompson et al. ....... 244/172.6 |
| 6,726,152 B2 * | 4/2004 | Higgins ..................... 244/158.4 |
| 2009/0126775 A1 * | 5/2009 | White et al. ................. 136/245 |
| 2012/0244739 A1 * | 9/2012 | Youngkin .................... 439/357 |

FOREIGN PATENT DOCUMENTS

| CN | 102611133 A | 7/2012 |
| EP | 2 214 288 A1 | 8/2010 |
| WO | WO 94/15834 A1 | 7/1994 |
| WO | WO 99/28801 A1 | 6/1999 |
| WO | WO 2012/048307 A1 | 4/2012 |

OTHER PUBLICATIONS

Chinese Office Action, Chinese Patent Application No. 2013104181482, dated Jun. 7, 2016.

* cited by examiner

*Primary Examiner* — Rexford Barnie
*Assistant Examiner* — Daniel Kessie
(74) *Attorney, Agent, or Firm* — Vista IP Law Group LLP; Cynthia A. Dixon (57) ABSTRACT

In one or more embodiments, the present disclosure teaches a method for reconfiguring a solar array. The method involves providing, for the solar array, at least one string of solar cells. The method further involves deactivating at least a portion of at least one of the strings of solar cells of the solar array when power produced by the solar array reaches a maximum power allowance threshold. In addition, the method involves activating at least a portion of at least one of the strings of the solar cells in the solar array when the power produced by the solar array reaches a minimum power allowance threshold.

18 Claims, 7 Drawing Sheets

| Year | Cell String Amps | Strings Active | SSU String Amps | % of SSU Maximum | kW, with new strings | kW, w/o new strings |
|---|---|---|---|---|---|---|
| 0 | 0.435 | 6 | 2.61 | 0.87 | 34.2 | 34.2 |
| 1 | 0.424 | 7 | 2.97 | 0.99 | 39.0 | 33.4 |
| 2 | 0.413 | 7 | 2.89 | 0.96 | 38.0 | 32.5 |
| 3 | 0.402 | 7 | 2.82 | 0.94 | 37.0 | 31.7 |
| 4 | 0.392 | 7 | 2.74 | 0.91 | 36.0 | 30.8 |
| 5 | 0.381 | 7 | 2.66 | 0.89 | 35.0 | 30.0 |
| 6 | 0.370 | 8 | 2.96 | 0.99 | 38.8 | 29.1 |
| 7 | 0.359 | 8 | 2.87 | 0.96 | 37.7 | 28.3 |
| 8 | 0.348 | 8 | 2.78 | 0.93 | 36.5 | 27.4 |
| 9 | 0.337 | 8 | 2.70 | 0.90 | 35.4 | 26.5 |
| 10 | 0.326 | 9 | 2.94 | 0.98 | 38.5 | 25.7 |
| 11 | 0.315 | 9 | 2.84 | 0.95 | 37.2 | 24.8 |
| 12 | 0.305 | 9 | 2.74 | 0.91 | 36.0 | 24.0 |
| 13 | 0.294 | 10 | 2.94 | 0.98 | 38.5 | 23.1 |
| 14 | 0.283 | 10 | 2.83 | 0.94 | 37.1 | 22.3 |
| 15 | 0.272 | 11 | 2.99 | 1.00 | 39.2 | 21.4 |
| 16 | 0.261 | 11 | 2.87 | 0.96 | 37.7 | 20.5 |
| 17 | 0.250 | 11 | 2.75 | 0.92 | 36.1 | 19.7 |
| 18 | 0.239 | 12 | 2.87 | 0.96 | 37.7 | 18.8 |
| 19 | 0.228 | 12 | 2.74 | 0.91 | 36.0 | 18.0 |
| 20 | 0.218 | 12 | 2.61 | 0.87 | 34.2 | 17.1 |
| 21 | 0.207 | 12 | 2.48 | 0.83 | 32.5 | 16.3 |
| 22 | 0.196 | 12 | 2.35 | 0.78 | 30.8 | 15.4 |
| 23 | 0.185 | 12 | 2.22 | 0.74 | 29.1 | 14.6 |
| 24 | 0.174 | 12 | 2.09 | 0.70 | 27.4 | 13.7 |
| 25 | 0.163 | 12 | 1.96 | 0.65 | 25.7 | 12.8 |
| 26 | 0.152 | 12 | 1.83 | 0.61 | 24.0 | 12.0 |
| 27 | 0.141 | 12 | 1.70 | 0.57 | 22.3 | 11.1 |
| 28 | 0.131 | 12 | 1.57 | 0.52 | 20.5 | 10.3 |
| 29 | 0.120 | 12 | 1.44 | 0.48 | 18.8 | 9.4 |
| 30 | 0.109 | 12 | 1.31 | 0.44 | 17.1 | 8.6 |

Blue   Green   Yellow   Red

FIG. 7

ON-ORBIT RECONFIGURABLE SOLAR ARRAY

GOVERNMENT LICENSE RIGHTS

This disclosure was made with Government support under Contract Number NAS15-10000 awarded by NASA. The U.S. Government has certain rights in this invention.

BACKGROUND

The present disclosure relates to solar arrays. In particular, it relates to on-orbit reconfigurable solar arrays.

SUMMARY

The present disclosure relates to a method, system, and apparatus for an on-orbit reconfigurable solar array. In one or more embodiments, the present disclosure teaches a method for reconfiguring a solar array. The method involves providing, for the solar array, at least one string of solar cells. The method further involves deactivating at least a portion of at least one of the strings of the solar cells of the solar array when power produced by the solar array reaches a maximum power allowance threshold (i.e. the power is equal to and/or higher than the maximum power allowance threshold). In addition, the method involves activating at least a portion of at least one of the strings of the solar cells in the solar array when the power produced by the solar array reaches a minimum power allowance threshold (i.e. the power is equal to and/or lower than the minimum power allowance threshold).

In one or more embodiments, the deactivating of at least a portion of at least one of the strings of the solar cells is performed by connecting at least one shunting plug to at least a portion of at least one of the strings of the solar cells to be deactivated. In at least one embodiment, the activating of a least a portion of at least one of the strings of the solar cells is performed by disconnecting at least one shunting plug from at least a portion of at least one of the strings of the solar cells to be activated, and by optionally connecting at least one cap to at least a portion of at least one of the strings of the solar cells to be activated.

In at least one embodiment, the deactivating of a least a portion of at least one of the strings of the solar cells is performed by closing at least one relay switch that is connected to at least a portion of at least one of the strings of the solar cells to be deactivated. In some embodiments, the activating of at least a portion of at least one of the strings of the solar cells is performed by opening at least one relay switch that is connected to at least a portion of at least one of the strings of the solar cells to be activated.

In one or more embodiments, the solar array is contained on a space station, such as the International Space Station (ISS). In at least one embodiment, the solar array is mounted onto a deployable blanket. In some embodiments, the solar array is contained on a satellite. In one or more embodiments, the satellite is a low earth orbiting (LEO) satellite, a medium earth orbiting (MEO) satellite, or a geosynchronous earth orbiting (GEO) satellite. In some embodiments, the solar array is contained on an unmanned vehicle, such as a deep-space vehicle.

In at least one embodiment, a reconfigurable solar array system is disclosed. In one or more embodiments, the system comprises a solar array comprising at least one string of solar cells. In at least one embodiment, at least a portion of at least one of the strings of the solar cells of the solar array is deactivated when power produced by the solar array reaches a maximum power allowance threshold (i.e. the power is equal to and/or higher than the maximum power allowance threshold). In some embodiments, at least a portion of at least one of the strings of the solar cells in the solar array is activated when the power produced by the solar array reaches a minimum power allowance threshold (i.e. the power is equal to and/or lower than the minimum power allowance threshold).

In one or more embodiments, when at least a portion of at least one of the strings of the solar cells is deactivated, at least one shunting plug is connected to at least a portion of at least one of the strings of the solar cells to be deactivated. In some embodiments, when at least a portion of at least one of the strings of the solar cells is activated, at least one shunting plug is disconnected from at least a portion of at least one of the strings of the solar cells to be activated, and at least one cap is optionally connected to at least a portion of at least one of the strings of the solar cells to be activated.

In at least one embodiment, when at least a portion of at least one of the strings of the solar cells is deactivated, at least one relay switch, which is connected to at least a portion of at least one of the strings of the solar cells to be deactivated, is closed. In some embodiments, when at least a portion of at least one of the strings of the solar cells is activated, at least one relay switch, which is connected to at least a portion of at least one of the strings of the solar cells to be activated, is open.

In one or more embodiments, a reconfigurable solar array apparatus is disclosed. The solar array apparatus comprises at least one string. The solar array apparatus further comprises a plurality of solar cells. In one or more embodiments, at least one string comprises a plurality of solar cells. In at least one embodiment, at least a portion of at least one of the strings of the solar array is deactivated when a power produced by the solar array reaches a maximum power allowance threshold. In some embodiments, at least a portion of at least one of the strings of the solar array is activated when the power produced by the solar array reaches a minimum power allowance threshold.

The features, functions, and advantages can be achieved independently in various embodiments of the present inventions or may be combined in yet other embodiments.

DRAWINGS

These and other features, aspects, and advantages of the present disclosure will become better understood with regard to the following description, appended claims, and accompanying drawings where:

DESCRIPTION

The methods and apparatus disclosed herein provide an operative system for an on-orbit reconfigurable solar array. Specifically, this system employs a solar array approach that permits a given solar array to act as a pseudo-constant power source, rather than degrading in capability, as typical solar arrays do. This is accomplished by a novel approach of switching in added capacity as the solar array degrades, thereby allowing power-limited downstream equipment to not have to withstand the full output of the solar array, at the beginning of life of the solar array. This approach solves a major problem related to the degradation and subsequent replacement of solar arrays, for example on the International Space Station (ISS). In addition, the disclosed solar array approach can be used effectively for deep-space and other unmanned vehicles.

The disclosed solar array approach, if employed by the ISS, solves the inability of the solar arrays on the ISS to provide a constant amount of power over extended periods of time. In addition, the approach eliminates the need to perform an additional solar array blanket change-out on the ISS (e.g., utilizing this approach will enable solar array blankets on the ISS to last roughly twice as long as conventional solar array blanket replacements). In addition, this approach continues to protect downstream hardware from the possibility of overload conditions, which would occur if alternative methods were use to provide extended solar array capability.

For deep-space applications, the disclosed solar array approach can be used to effectively create a smaller solar array for the space vehicle when it is located close to the sun and, as such, does not require as much solar panel area to meet its power generation requirements. For a solar array that employs a shunt regulator system, this approach permits the use of much smaller downstream wiring, rotary joint power crossings, and electronics as well as greatly reduces the heat generation from the voltage regulation process.

Currently, for a conventional solar array in a long-term application like the International Space Station (ISS), the only solution is to replace the solar array at certain points in time, as it degrades over time. In the case of the ISS, a combination of a quicker than expected solar array degradation and a strong desire to keep the ISS operational for many decades is leading to the possibility of multiple solar array change-outs occurring in the future. The obvious drawback to changing out the solar arrays multiple times on the ISS is the tremendous amount of upmass and Extra-Vehicular Activity (EVA) time required. A less obvious drawback is that the solar arrays will be severely degraded prior to a change-out, due to the desire to extend the solar array life as long as possible. With a conventional solar array change-out, electrical power production from the new solar array will degrade constantly, from the first day it is used on orbit, and the only way to recover as-new capability is to replace the solar array.

Currently, for deep-space applications, approaches used in industry for solar arrays are: the first approach (1) to design wiring and downstream electronics for a worst-case scenario (i.e., for peak current), the second approach (2) to continuously point the solar array away from the sun when too much current would be generated if it were directly pointed at the sun, and the third approach (3) to employ some type of shading or shadowing method to block sunlight from reaching some of the solar cells of the solar array. The disadvantage of the first approach (1) is the extra mass, cost, and heat rejection capability required. The disadvantage of the second approach (2) is the mission requirement to not allow direct sunlight to reach the space vehicle when traveling in regions of high solar flux. This requires proper solar array pointing at all times and may limit vehicle attitude, depending on the design of the vehicle. This also leaves the vehicle vulnerable to damage from receiving direct sunlight during a malfunction where attitude control, and/or solar array pointing capability is temporarily lost. The disadvantage of the third approach (3) is the need to have a complex mechanism and/or very stringent vehicle attitude control requirements to assure that solar flux on the solar arrays remains limited.

For implementation on the ISS, the disclosed solar array approach takes advantage of the already-existing solar array deployment capability and available panel area. Specifically, the new solar array cells on ISS will be roughly twice as efficient when converting sunlight to electricity, and thus, for the given panel area of an ISS solar array, there exists the possibility of providing double the amount of power. The issue for the ISS (and possibly other solar array applications that might have additional constraints) is that downstream limitations on throughput power prevent the use of this power capability. Put another way, a conventional high-capacity solar array, when new, would simply be too powerful for the downstream electronics, wiring, and further downstream hardware. However, with utilizing this disclosed solar array approach, a fully-populated solar array would still be built, but sections of the solar array would be shut down during its early and mid-life via EVA shunting plugs (and/or via remotely controlled relays). As solar array power production declines (on a per-square meter basis), shunting plugs would be removed (or relays opened), thus allowing additional panel area to be brought on-line and thereby providing a pseudo-constant solar array power source to downstream loads, which will effectively double the life of the new solar array.

For deep-space applications, the concept of shunting parts of the solar array allows the solar array to effectively act as a large radiator and dissipate heat (during the shunting process) that would otherwise have to be dissipated at the shunt regulator and associated upstream wiring. Additionally, this concept eliminates the hazards of direct-pointing of the solar array towards the sun, and/or having an ineffective solar array shading system.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

Figure 1:
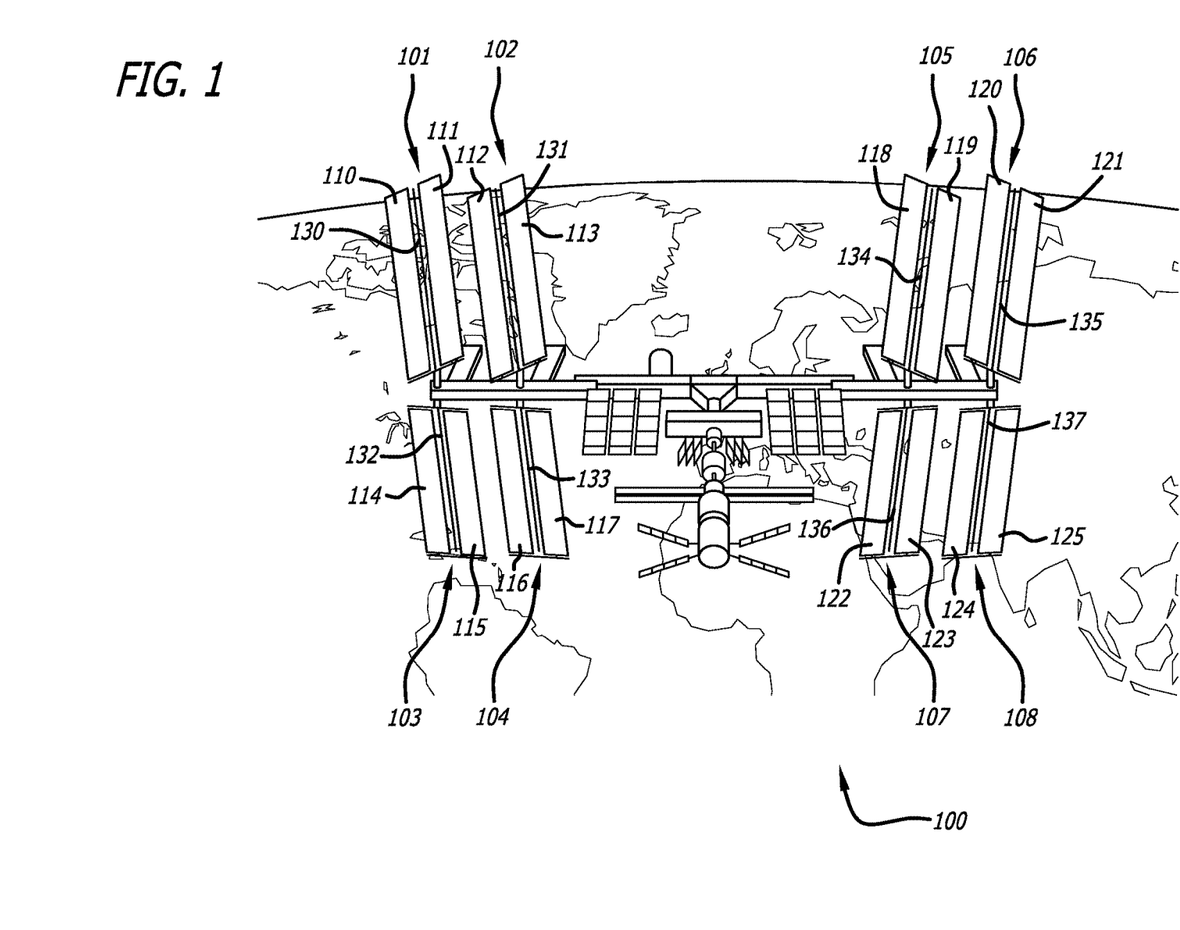
FIG. 1 is a diagram of the International Space Station (ISS), which may employ the disclosed reconfigurable solar array system, in accordance with at least one embodiment of the present disclosure.

FIG. 1 is a diagram of the International Space Station (ISS) 100, which may employ the disclosed reconfigurable solar array system, in accordance with at least one embodiment of the present disclosure. As is generally known, solar arrays typically degrade from the day they are activated in the space environment, and the solar arrays of the ISS are no exception. Due to this degradation, there exists a significant possibility that the ISS will need to be provided with a new solar array capability prior to the year 2028, which is the expected End of Life (EOL) for the ISS.

The ISS has some downstream "choke points" that limit how much power a solar array can generate, without overloading the downstream hardware. The key choke point is the Sequential Shunt Unit (SSU), which has already had to be uprated, after its design, due to a higher than projected Beginning of Life (BOL) performance from the existing ISS solar arrays. As such, future up-rating of the SSUs entails significant risk to that hardware, while replacing the existing SSU with an uprated unit will be costly and will come up against the current carrying capability of the solar array and the mast canister wiring, which has some, but not a lot of margin. A second choke point is the rating of the Beta Gimbal crossings (e.g., gimballing or rotating along the alpha and beta axes of the solar array wing allows the solar cells to directly point to the sun regardless of the orientation of the space station), which can also see full solar array current during very high loads and downstream faults. Therefore, a new solar array designed for the ISS is limited to the existing downstream capability, and will then, like all solar arrays, gradually degrade and lose power over time. The disclosed solar array design of the present disclosure provides one possible solution for the ISS to obtain a pseudo-constant power output solar array, should the ISS solar arrays require replacement.

Due to structural constraints and limitations, replacement solar array blankets for the ISS need to have roughly the same area as the existing solar array blankets. However, aerospace solar cell efficiencies have doubled since the ISS was designed and built. Therefore, only half of the existing solar array blanket area is required to match the BOL solar array life of the original blankets. If the solar array blankets were fully populated with the high-efficiency solar cells, then the downstream choke points would be overloaded and hardware would be at risk. The disclosed solar array design provides a way to fully populate the replacement solar array blankets, but still not exceed the downstream choke point limitations. Essentially, only half of the new solar array blanket would be used, but gradually more areas would be brought on-line as the solar array cells degrade over time.

In FIG. 1, The ISS 100 is shown to comprise eight (8) solar arrays 101-108. Each solar array 101-108 comprises two (2) solar array blankets 110-125. For example, solar array 101 comprises solar array blanket 110 and solar array blanket 111. Each solar array blanket 110-125 is approximately 15 feet in width and 108 feet in length. In addition, for each solar array 101-108, a mast 130-137 is located in between the solar array blankets 110-125. For example, for solar array 101, mast 130 is located in between solar array blanket 110 and solar array blanket 111.

Solar array cells are mounted on the deployable solar array blankets 110-125, which can be folded like an accordion. During solar array blanket change-out, the old solar array blankets 110-125 are folded like an accordion down the length of their respective mast 130-137. The old solar array blankets 110-125 are then removed from the masts 130-137, and new solar array blankets 110-125 are attached to the masts 130-137. The new solar array blankets 110-125 are then extended (i.e. deployed) along the length of their respective mast 130-137.

Figure 2:
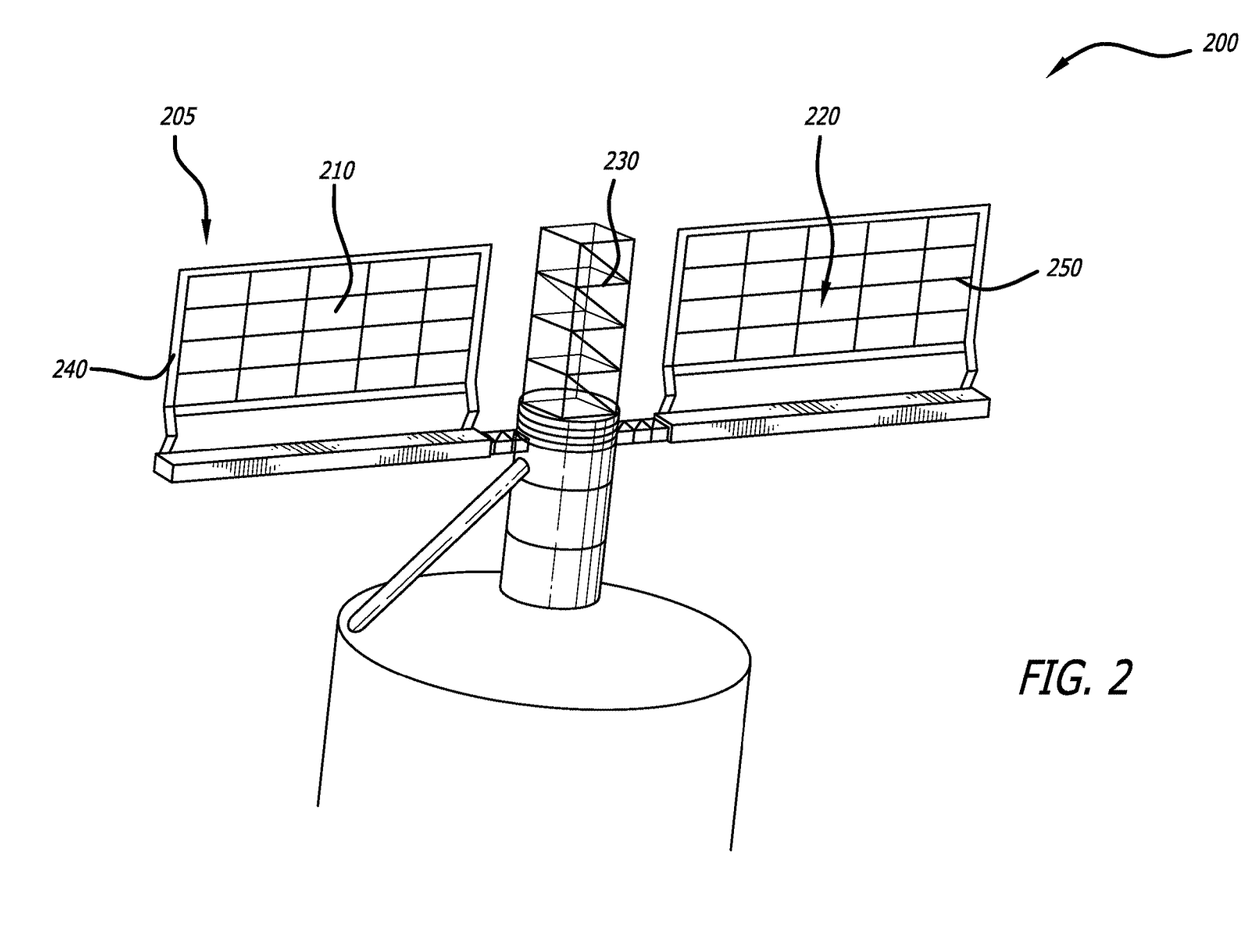
FIG. 2 is a diagram of a portion of the ISS of FIG. 1, which may employ the disclosed reconfigurable solar array system, in accordance with at least one embodiment of the present disclosure.

FIG. 2 is a diagram 200 of a portion of the ISS 100 of FIG. 1, which may employ the disclosed reconfigurable solar array system, in accordance with at least one embodiment of the present disclosure. In this figure, a close up view of single solar array 205 of the ISS 100 is shown. In this view, a mast 230 is shown to be located in between two solar array blankets 210, 220. On each solar array blanket 210, 220, a grid of boxes 240, 250 is shown. Each box 240, 250 comprises forty (40) solar cells. Ten (10) boxes 240, 250 of the grid comprises one (1) string of solar cells for the solar array 205. Each solar array blanket 210, 220, comprises a total of forty-one (41) strings of solar cells.

Figure 3:
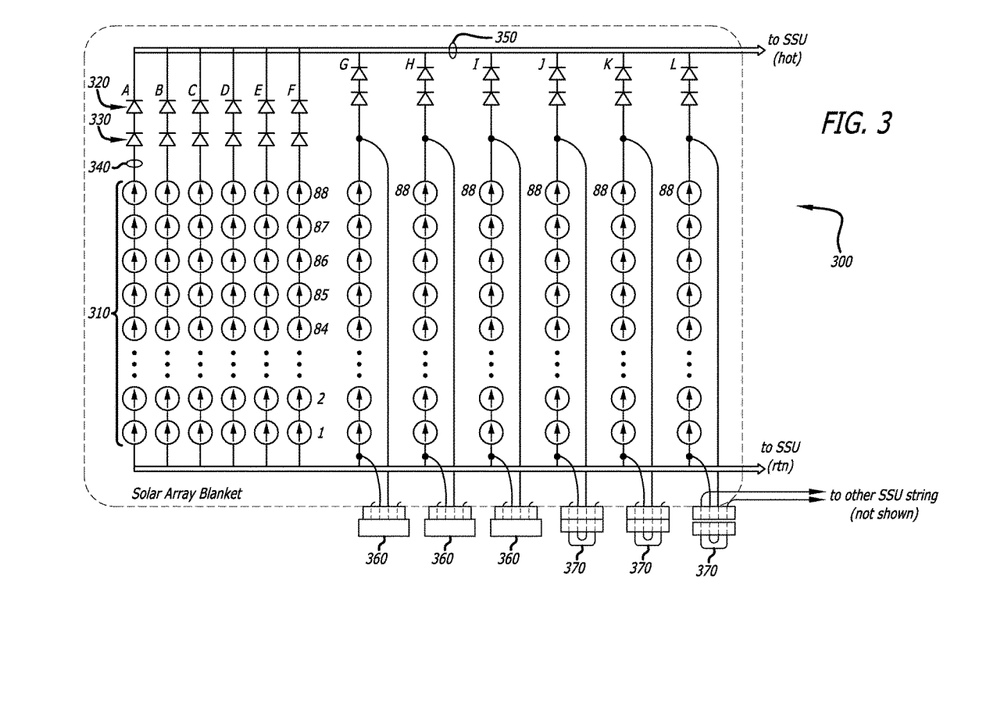
FIG. 3 is a diagram of the disclosed reconfigurable solar array system employed by the ISS, in accordance with at least one embodiment of the present disclosure.

FIG. 3 is a diagram of the disclosed reconfigurable solar array system as would be employed by the ISS, in accordance with at least one embodiment of the present disclosure. In this figure, a single solar array SSU string 300 is shown. As previously mentioned above, a single solar array blanket comprises forty-one (41) SSU strings 300. Each of the SSU strings 300 are wired 350 with sixteen (16) gauge wiring for a maximum rating of 3.0 Amps of current. Each SSU string 300 comprises a plurality of cell strings (e.g., cell strings A-L) 320. Cell strings A through F 320 always provide current to the SSU, while cell strings G through L 320 can be individually switched in to provide supplement current to the SSU, as the solar array degrades over time. In addition, twenty-two (22) gauge wiring is used for the wiring 340 of each of the cell strings 320.

Each cell string 320 comprises eighty-eight (88) solar cells 310 as well as two or more diodes 330. Each of the solar cells 310 provides 0.435 Amps of current at 2.3 Volts direct current (Vdc). The diodes 330 are employed to ensure that backfeeding does not occur, which could overload the circuits that are shadowed and, thus, cause damage to the circuits.

Also shown in FIG. 3, shunting plugs 370 are shown to be shunting cell strings J, K, and L 320. Each shunting plug 370 containing wiring for all 41 SSU strings 300 (i.e. six (6) plugs per solar array blanket, in this example). When the shunting plugs 370 are installed (i.e. connected) to cell strings 320, as is shown in this figure, the current in those cell strings 320 is shunted, thereby essentially shutting off the cell strings 320 (i.e., cell strings J, K, and L are essentially shut off).

FIG. 3 also shows caps 360 installed (i.e. connected) to cell strings G, H, and I 320. The removal of shunting plugs 370 from cell strings 320 and the optional replacement of caps 360 to those cell strings 320 allows for the cell strings 320 to come back on-line and deliver power to the ISS loads. As such, in this figure, cell strings G, H, and I 320 are on-line and able to deliver power to the ISS loads. It should be noted that some embodiments of the present disclosure do not employ caps 360 to activate the cell strings 320.

Figure 4:
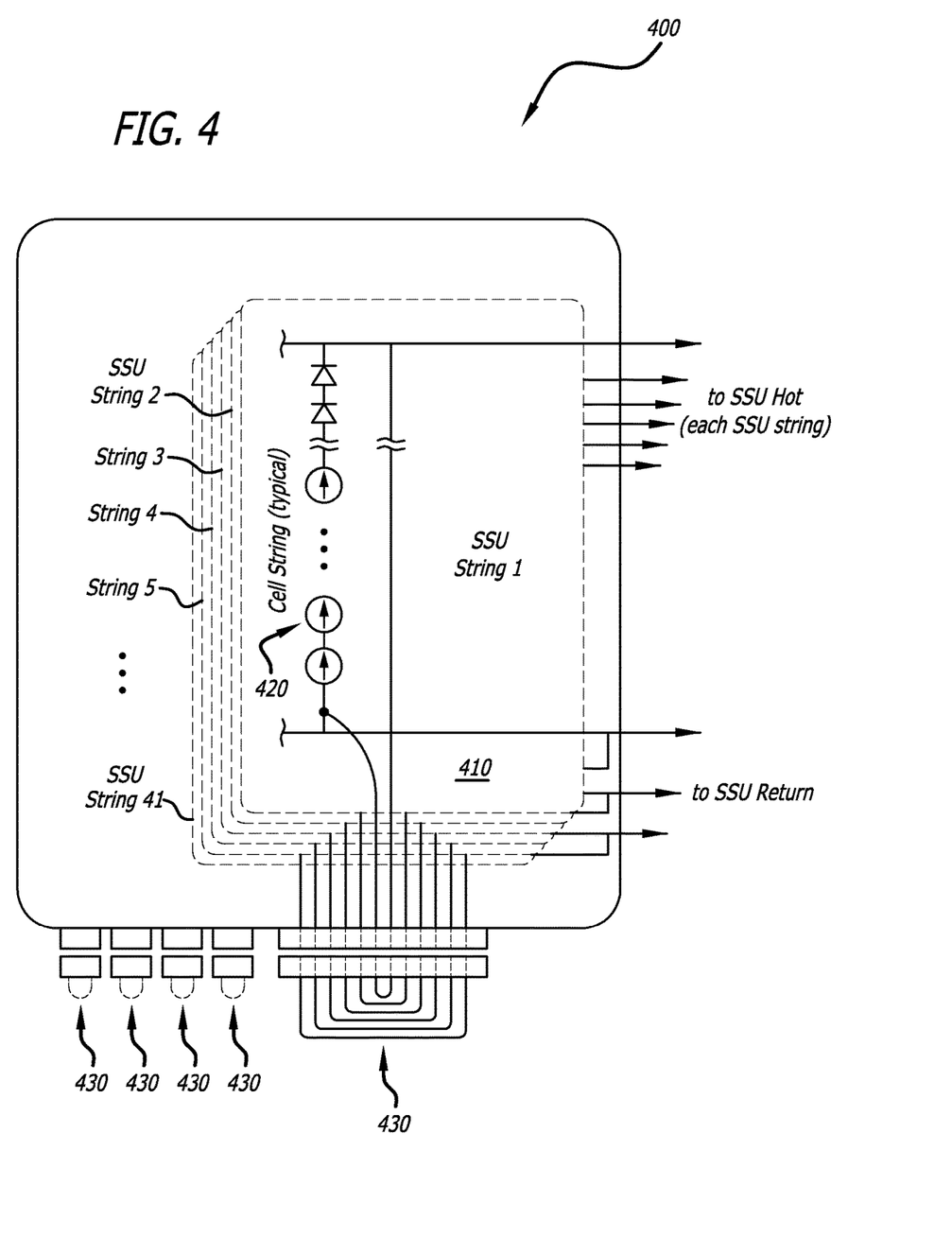
FIG. 4 a diagram of the disclosed reconfigurable solar array system employed by the ISS where shunting plugs are employed, in accordance with at least one embodiment of the present disclosure.

FIG. 4 a diagram 400 of the disclosed reconfigurable solar array system employed by the ISS where shunting plugs 430 are employed, in accordance with at least one embodiment of the present disclosure. In this figure, forty-one (41) SSU strings 410 are shown. During operation of the disclosed reconfigurable solar array system, when the power produced by the solar array reaches a maximum power allowance threshold (i.e. the power is equal to and/or higher than the maximum power allowance threshold), at least one cell string 420 of each of the SSU strings 410 is deactivated by connecting at least one shunting plug 430 to the cell string(s) 420 of the SSU strings 410 to be deactivated. For example, cell string 420 of the SSU strings 410 is deactivated by connecting shunting plug 430 to the cell string 420 of the SSU strings 410. It should be noted that each shunting plug 430 will disable one cell string 420 per SSU string 410. As such, shunting plug 430 reaches (i.e. shunts) one cell string 420 for each of the 41 SSU strings 410.

In addition, during operation of the disclosed reconfigurable solar array system, when power produced by the solar array reaches a minimum power allowance threshold (i.e. the power is equal to and/or lower than the minimum power allowance threshold), at least one cell string 420 of the SSU strings 410 is activated by disconnecting at least one shunting plug 430 from the cell string(s) 420 of the SSU strings 410 to be activated, and connecting at least one cap (not shown) to the cell string(s) 420 of the SSU strings 410 to be activated. For example, cell string 420 of the SSU strings 410 is activated by disconnecting shunting plug 430 from the cell string 420 of the SSU strings 410 and by connecting a cap (not shown) to the cell string 420 of the SSU strings 410.

Figure 5:
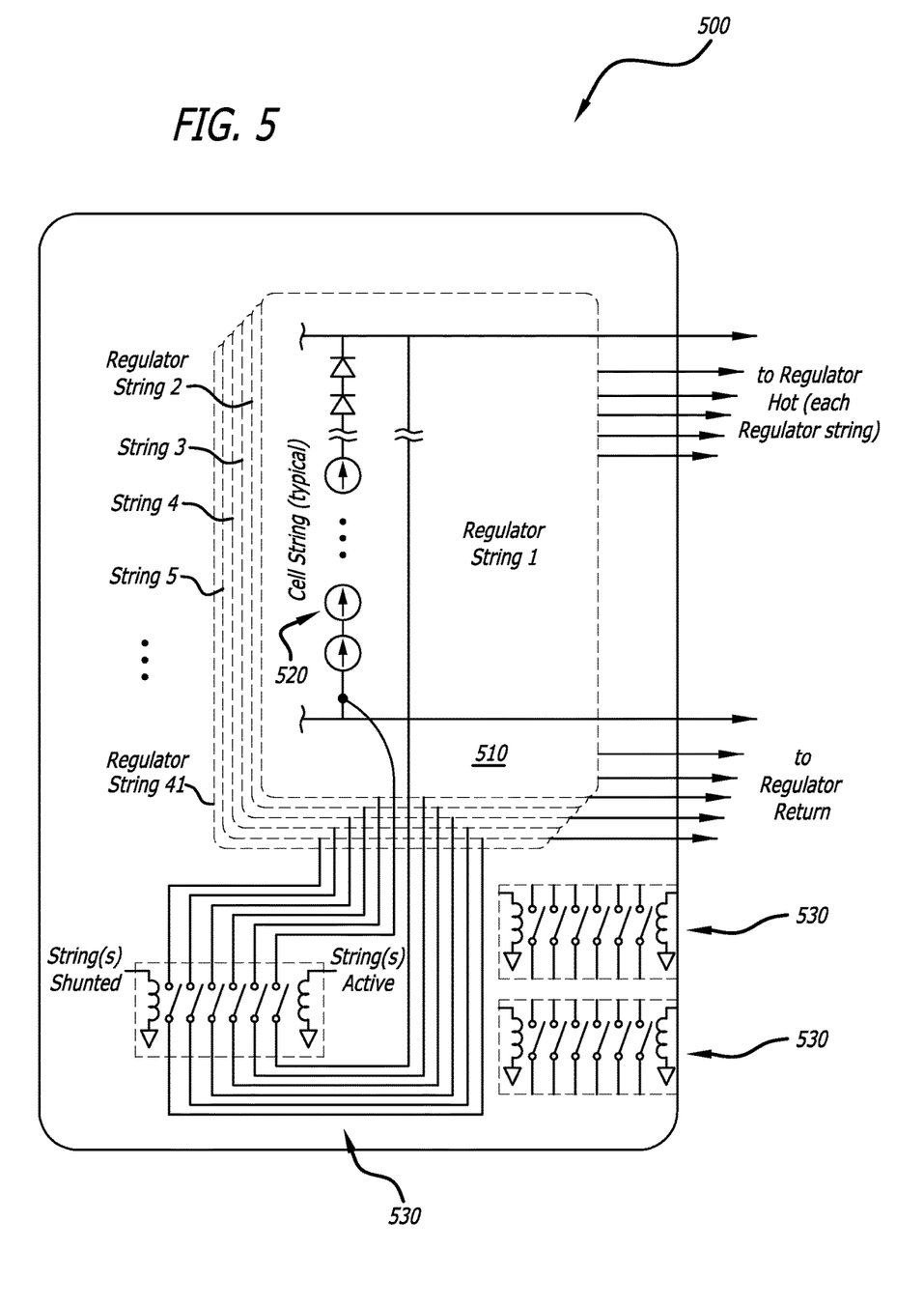
FIG. 5 a diagram of the disclosed reconfigurable solar array system employed by the ISS where relay switches are employed, in accordance with at least one embodiment of the present disclosure.

FIG. 5 a diagram 500 of the disclosed reconfigurable solar array system employed by the ISS where relay switches 530 are employed, in accordance with at least one embodiment of the present disclosure. In this figure, forty-one (41) SSU strings 510 are shown. During operation of the disclosed reconfigurable solar array system, when power produced by the solar array reaches a maximum power allowance threshold (i.e. the power is equal to and/or higher than the maximum power allowance threshold), at least one cell string 520 of the SSU strings 510 is deactivated by closing at least one relay switch 530 that is connected to the cell string(s) 520 of the SSU strings 510 to be deactivated. For example, cell string 520 of the SSU strings 510 is deactivated by closing relay switch 530 that is connected to the cell string 520 of the SSU strings 510. It should be noted that each relay switch 530, when closed, will disable one cell string 520 per SSU string 510. As such, relay switch 530 can reach (i.e. shunt) one cell string 520 for each of the 41 SSU strings 510.

In addition, during operation of the disclosed reconfigurable solar array system, when power produced by the solar array reaches a minimum power allowance threshold (i.e. the power is equal to and/or lower than the minimum power allowance threshold), at least one cell string 520 of the SSU strings 510 is activated by opening at least one relay switch 530 that is connected to the cell string(s) 520 of the SSU strings 510 to be activated. For example, cell string 520 of the SSU strings 510 is activated by opening relay switch 530 that is connected to the cell string 520 of the SSU strings 510. It should be noted that each relay switch 530, when open, will activate one cell string 520 per SSU string 510. As such, relay switch 530 can activate one cell string 520 for each of the 41 SSU strings 510. It should be noted that the relay switches 530 can be commanded via the ground and/or via on-board processing.

Figure 6:
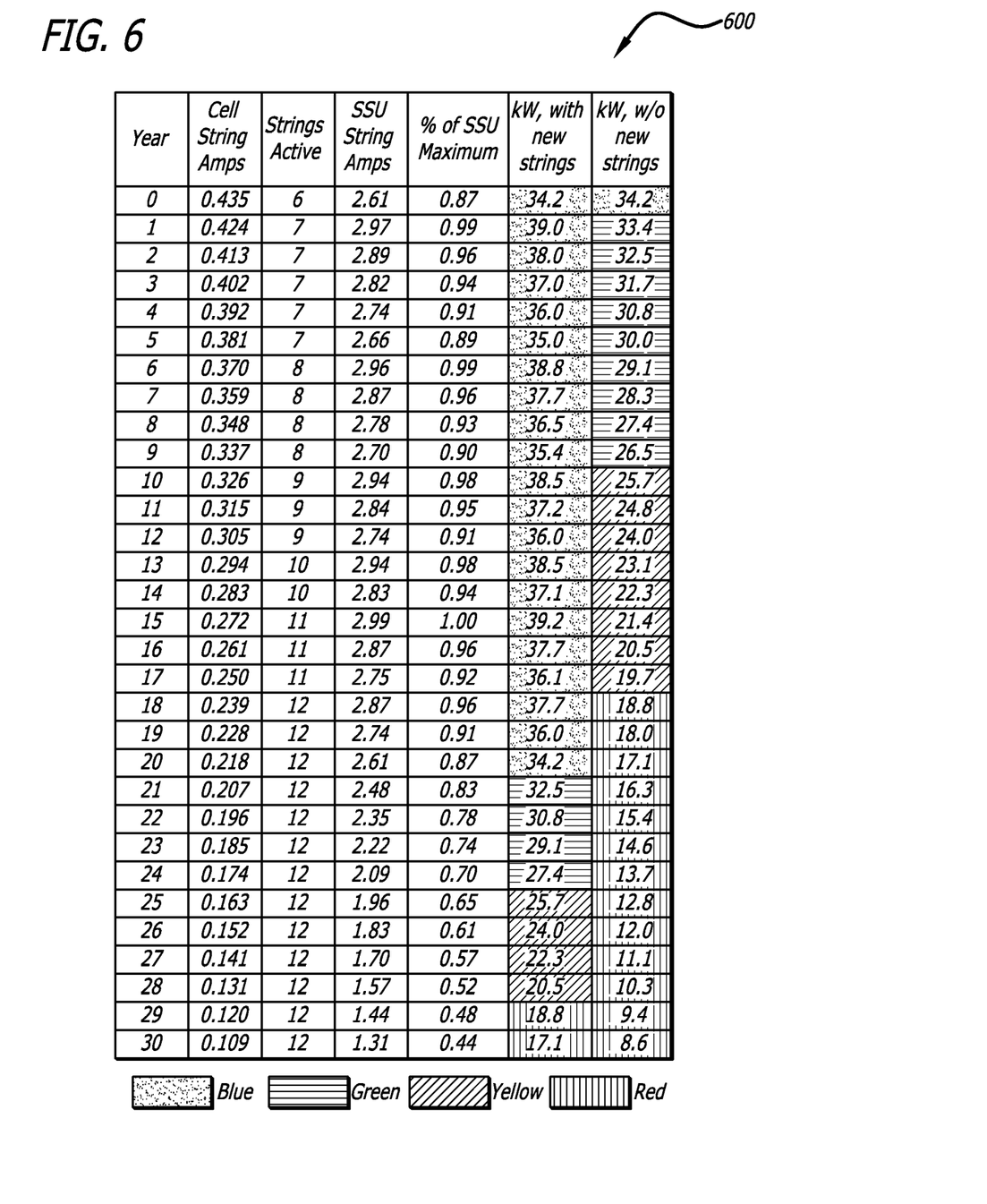
FIG. 6 is a table showing simulated performance data for the disclosed reconfigurable solar array system employed by the ISS, in accordance with at least one embodiment of the present disclosure.

FIG. 6 is a table 600 showing simulated performance data for the disclosed reconfigurable solar array system employed by the ISS, in accordance with at least one embodiment of the present disclosure. For the solar arrays of the ISS, BOL cell string current is 0.435 Amps. The solar cells degrade at 2.5 percent (%) of their original capability every year (i.e. 10.9 milliamperes per year (mA/yr)). This percentage of degradation is consistent with performance seen for the first two on-orbit ISS solar arrays over the course of a decade.

The ISS has a constraint where the SSU string current cannot exceed 3.0 Amps. The initial configuration for the on-orbit reconfigurable solar arrays of the ISS has as many cell strings as possible on-line, without exceeding the SSU string capacity. Once solar cell degradation provides enough margin to bring additional cell strings on-line, the shunting plugs are removed, one at a time, to restore the solar arrays to nearly full capability.

For the data contained in table 600, it is assumed that the solar array is populated with twelve (12) cell strings per SSU string, where six (6) of which are initially shunted. The shunted cell strings are assumed to degrade at the same rate as the active cell strings (same as presently on the ISS).

The simulation shows that the disclosed solar array provides between eighty-seven (87) and ninety-nine (99) percent (%) of the maximum SSU capacity for the first twenty (20) years of life, as is denoted by the blue shaded portion (i.e. the stipple shaded portion) of the data in the table 600. The disclosed solar array is essentially a constant-power solar array at this time (it should be noted that this capability only exists for one year, with a standard conventional solar array). After that time, the disclosed solar array capacity will decline at a high rate, although capacity will still stay much higher than a standard conventional solar array. The data in table 600 shows that the disclosed solar array loses its usefulness eleven (11) years after a standard conventional solar array.

Figure 7:
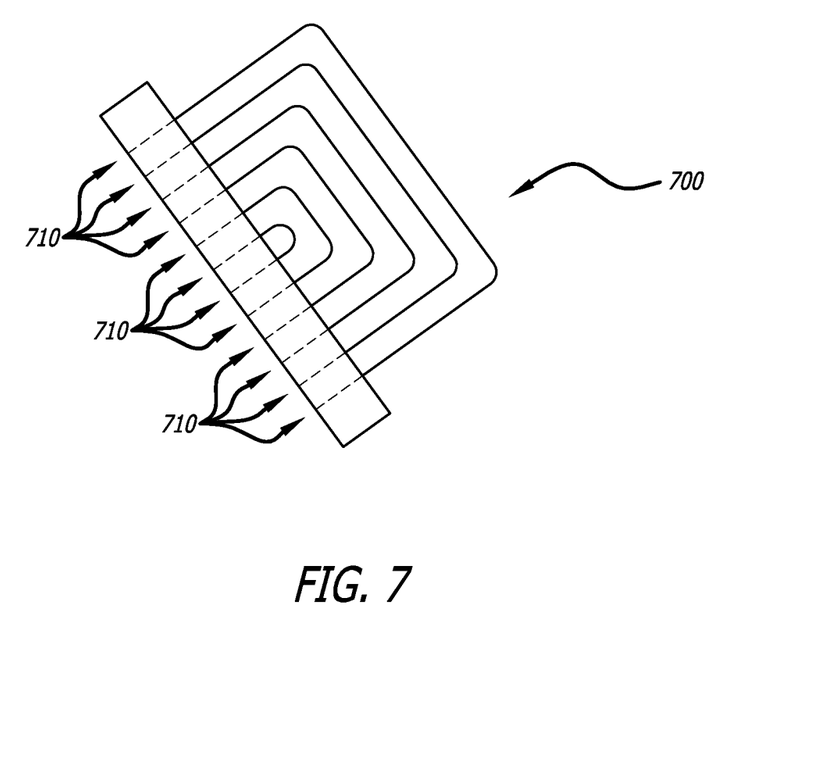
FIG. 7 is a diagram of an exemplary shunting plug that may be employed by the disclosed reconfigurable solar array system, in accordance with at least one embodiment of the present disclosure.

FIG. 7 is a diagram of an exemplary shunting plug 700 that may be employed by the disclosed reconfigurable solar array system, in accordance with at least one embodiment of the present disclosure. In this figure, the shunting plug 700 is shown to have a multiple connections 710 that are each to be connected to a single cell string for each of the SSU strings of the disclosed solar array. The wiring within the shunting plug 700 is twenty-two (22) gauge. This size of wiring will be able to accommodate the level of current in a cell string of the ISS, which is about 0.435 Amps.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

I claim:

1. A method for reconfiguring a solar array, the method comprising:
    providing, for the solar array, a plurality of strings of solar cells;
    deactivating at least a portion of at least one of the strings of the solar cells of the solar array, when a power produced by the solar array reaches a maximum power allowance threshold; and
    activating at least a portion of at least one of the strings of the solar cells in the solar array, when the power produced by the solar array reaches a minimum power allowance threshold,
    wherein the deactivating of at least a portion of the at least one of the strings of the solar cells is performed by connecting a respective connection on at least one shunting plug to each of the at least one of the strings of the solar cells to be deactivated, wherein the at least one shunting plug allows for dissipation of heat.

2. The method of claim 1, wherein the activating of at least a portion of the at least one of the strings of the solar cells is performed by disconnecting each of the connections on the at least one shunting plug from the at least one of the strings of the solar cells to be activated.

3. The method of claim 1, wherein the deactivating of at least a portion of the at least one of the strings of the solar cells is performed by closing at least one relay switch that is connected to the at least a portion of the at least one of the strings of the solar cells to be deactivated.

4. The method of claim 1, wherein the activating of at least a portion of the at least one of the strings of the solar cells is performed by opening at least one relay switch that is connected to the at least a portion of the at least one of the strings of the solar cells to be activated.

5. The method of claim 1, wherein the solar array is contained on one of a space station, a satellite, and an unmanned vehicle.

6. The method of claim 5, wherein the satellite is one of a low earth orbiting (LEO) satellite, a medium earth orbiting (MEO) satellite, and a geosynchronous earth orbiting (GEO) satellite.

7. The method of claim 1, wherein the solar array is mounted onto a deployable blanket.

8. A reconfigurable solar array system, the system comprising:
   a solar array comprising a plurality of strings of solar cells,
   wherein at least a portion of at least one of the strings of the solar cells of the solar array is deactivated, when a power produced by the solar array reaches a maximum power allowance threshold, and
   wherein at least a portion of at least one of the strings of the solar cells in the solar array is activated, when the power produced by the solar array reaches a minimum power allowance threshold,
   wherein when at least a portion of the at least one of the strings of the solar cells is deactivated, a respective connection on at least one shunting plug is connected to each of the at least one of the strings of the solar cells to be deactivated, wherein the at least one shunting plug allows for dissipation of heat.

9. The system of claim 8, wherein when at least a portion of the at least one of the strings of the solar cells is activated, each of the connections on the at least one shunting plug is disconnected from the at least one of the strings of the solar cells to be activated.

10. The system of claim 8, wherein when at least a portion of the at least one of the strings of the solar cells is deactivated, at least one relay switch, which is connected to the at least a portion of the at least one of the strings of the solar cells to be deactivated, is closed.

11. The system of claim 8, wherein when at least a portion of the at least one of the strings of the solar cells is activated, at least one relay switch, which is connected to the at least a portion of the at least one of the strings of the solar cells to be activated, is open.

12. The system of claim 8, wherein the solar array is contained on one of a space station, a satellite, and an unmanned vehicle.

13. The system of claim 12, wherein the satellite is one of a low earth orbiting (LEO) satellite, a medium earth orbiting (MEO) satellite, and a geosynchronous earth orbiting (GEO) satellite.

14. The system of claim 8, wherein the solar array is mounted onto a deployable blanket.

15. A reconfigurable solar array apparatus, the solar array comprising:
   a plurality of strings; and
   a plurality of solar cells, wherein the at least one string comprises the plurality of solar cells,
   wherein at least a portion of at least one of the strings of the solar array is deactivated, when a power produced by the solar array reaches a maximum power allowance threshold, and
   wherein at least a portion of at least one of the strings of the solar array is activated, when the power produced by the solar array reaches a minimum power allowance threshold,
   wherein when at least a portion of the at least one of the strings of the solar array is deactivated, a respective connection on at least one shunting plug is connected to each of the at least one of the strings of the solar array to be deactivated, wherein the at least one shunting plug allows for dissipation of heat.

16. The apparatus of claim 15, wherein when at least a portion of the at least one of the strings of the solar array is activated, each of the connections on the at least one shunting plug is disconnected from the at least one of the strings of the solar array to be activated.

17. The apparatus of claim 15, wherein the solar array further comprises at least one relay switch,
   wherein when at least a portion of the at least one of the strings of the solar array is deactivated, the at least one relay switch, which is connected to the at least a portion of the at least one of the strings of the solar array to be deactivated, is closed, and
   wherein when at least a portion of the at least one of the strings of the solar array is activated, the at least one relay switch, which is connected to the at least a portion of the at least one of the strings of the solar array to be activated, is open.

18. The apparatus of claim 15, wherein the solar array is contained on one of a space station, a satellite, and an unmanned vehicle.

* * * * *